(12) United States Patent
Webb et al.

(10) Patent No.: US 8,986,029 B2
(45) Date of Patent: Mar. 24, 2015

(54) DOCK CONNECTOR WITH COMPLIANCE MECHANISM

(71) Applicant: Apple Inc., Cupertino, CA (US)

(72) Inventors: Michael J. Webb, Scotts Valley, CA (US); Ian P. Colahan, Menlo Park, CA (US); Paul J. Thompson, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 67 days.

(21) Appl. No.: 13/791,524

(22) Filed: Mar. 8, 2013

(65) Prior Publication Data

US 2014/0069710 A1     Mar. 13, 2014

Related U.S. Application Data

(60) Provisional application No. 61/699,838, filed on Sep. 11, 2012.

(51) Int. Cl.
*H01R 13/64* (2006.01)
*H05K 7/14* (2006.01)

(52) U.S. Cl.
CPC ..................................... *H05K 7/14* (2013.01)
USPC ........................... 439/248; 174/135; 361/724

(58) Field of Classification Search
USPC ............ 174/135; 439/246–248, 929; 361/724
See application file for complete search history.

(56) References Cited

U.S. PATENT DOCUMENTS

| | | | |
|---|---|---|---|
| 6,049,192 A | 4/2000 | Kfoury et al. | |
| 6,193,546 B1 | 2/2001 | Sadler | |
| 6,290,534 B1 | 9/2001 | Sadler | |
| 6,527,572 B2 * | 3/2003 | Jou | 439/248 |
| 6,716,058 B2 | 4/2004 | Youn | |
| 6,898,080 B2 | 5/2005 | Yin et al. | |
| 6,926,130 B2 * | 8/2005 | Skowronski | 191/12.2 R |
| 6,994,575 B1 | 2/2006 | Clark et al. | |
| 7,014,486 B1 | 3/2006 | Wu et al. | |

(Continued)

FOREIGN PATENT DOCUMENTS

AU     2012101888 A4     2/2013
EP        0 755 618 B1     6/2000

OTHER PUBLICATIONS

International Search Report and Written Opinion mailed on Jul. 8, 2013 for PCT Patent Application No. PCT/US2013/034597, 16 pages.

*Primary Examiner* — Dhirubhai R Patel
(74) *Attorney, Agent, or Firm* — Kilpatrick Townsend & Stockton LLP

(57) ABSTRACT

Docking stations having a connector with a compliance mechanism to provide improved durability and flexibility are provided herein. The compliance mechanism may be attached to a connecter in a base of a docking station that extends through an opening in a housing or shell attached to the base. The compliance mechanism may include any or all of a flexure, a torsion bar, damping members, a compressive foam member, and an engineered base plate. The compliance mechanism may be configured to provide sufficient rigidity to the connector to support a portable device when mounted on the connector within the dock in an upright position, sufficient flexibility to allow angular displacement of a mounted portable device, and sufficient elasticity to provide a resilient biasing force to return the connector and a mounted portable device from a displaced position to the upright position.

25 Claims, 13 Drawing Sheets

(56) References Cited

U.S. PATENT DOCUMENTS

| | | |
|---|---|---|
| 7,066,752 B2 | 6/2006 | Hsu et al. |
| 7,238,042 B2 | 7/2007 | Chen et al. |
| 7,405,929 B1 | 7/2008 | Chuang et al. |
| 7,426,108 B2 * | 9/2008 | Carnevali ................. 361/679.41 |
| 7,473,141 B2 | 1/2009 | Liao |
| 7,488,215 B2 | 2/2009 | Mayette et al. |
| 7,513,801 B2 | 4/2009 | Cheng et al. |
| 7,538,792 B2 | 5/2009 | Takahashi |
| 7,580,225 B2 | 8/2009 | Crooijmans et al. |
| 7,684,186 B2 | 3/2010 | Chang |
| 7,719,830 B2 | 5/2010 | Howarth et al. |
| 7,729,801 B2 | 6/2010 | Abramson |
| 7,744,423 B2 | 6/2010 | Funahashi |
| 7,789,711 B2 | 9/2010 | Wu |
| 7,832,645 B2 | 11/2010 | Chen et al. |
| 7,850,484 B2 | 12/2010 | Hayashi et al. |
| 7,931,494 B2 | 4/2011 | Long |
| 7,933,117 B2 | 4/2011 | Howarth et al. |
| 8,083,195 B2 | 12/2011 | Osada |
| 8,113,873 B1 | 2/2012 | Sarraf |
| 8,139,353 B2 | 3/2012 | Slaby et al. |
| 8,152,561 B2 | 4/2012 | Long |
| 8,210,871 B2 | 7/2012 | Neu et al. |
| 8,323,040 B2 | 12/2012 | Prest |
| 8,355,690 B2 | 1/2013 | Krampf et al. |
| 8,366,480 B2 | 2/2013 | Neu et al. |
| 8,721,356 B2 * | 5/2014 | Webb et al. ................... 439/248 |
| 2002/0024794 A1 | 2/2002 | Lin et al. |
| 2002/0032042 A1 | 3/2002 | Poplawsky et al. |
| 2003/0008566 A1 | 1/2003 | Kato et al. |
| 2003/0017746 A1 | 1/2003 | Lee |
| 2003/0148740 A1 | 8/2003 | Yau et al. |
| 2006/0063434 A1 | 3/2006 | Bergmann et al. |
| 2006/0141856 A1 | 6/2006 | Chen et al. |
| 2006/0172607 A1 | 8/2006 | Bangert |
| 2006/0250764 A1 | 11/2006 | Howarth et al. |
| 2006/0258224 A1 | 11/2006 | Liao |
| 2006/0276083 A1 | 12/2006 | Sun |
| 2007/0153463 A1 | 7/2007 | Choi |
| 2008/0259550 A1 | 10/2008 | Lien |
| 2008/0293303 A1 | 11/2008 | Liao |
| 2009/0009957 A1 | 1/2009 | Crooijmans et al. |
| 2010/0009574 A1 | 1/2010 | Shi et al. |
| 2010/0062615 A1 | 3/2010 | Prest |
| 2011/0070757 A1 | 3/2011 | Krampf et al. |
| 2011/0070777 A1 | 3/2011 | Krampf et al. |
| 2011/0095724 A1 | 4/2011 | Byrne |
| 2011/0134601 A1 | 6/2011 | Sa |
| 2011/0164375 A1 | 7/2011 | Hayashida et al. |
| 2011/0250786 A1 | 10/2011 | Reid |
| 2012/0034819 A1 | 2/2012 | Chen |
| 2013/0012041 A2 | 1/2013 | Krampf et al. |

* cited by examiner

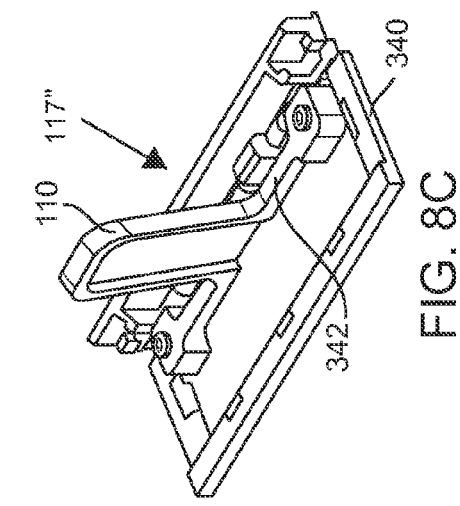
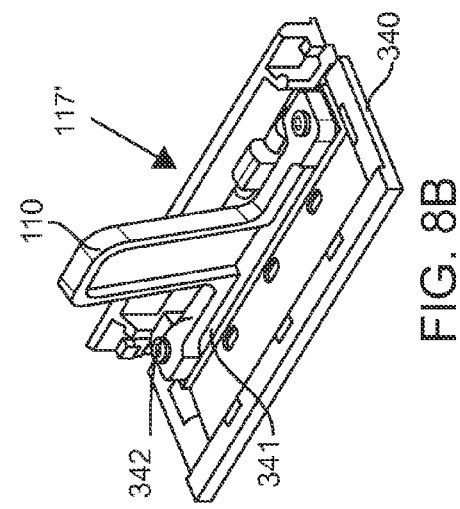
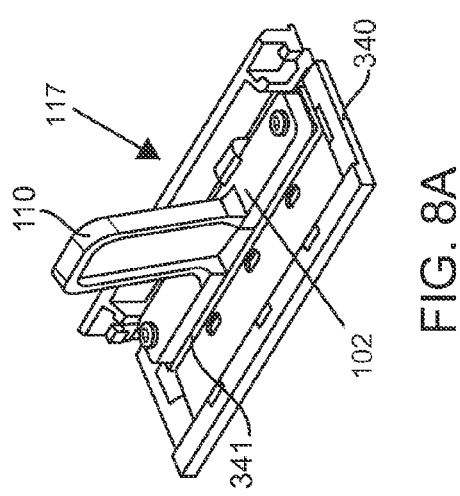
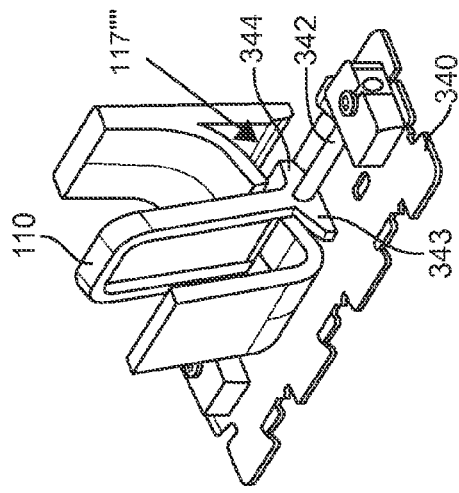
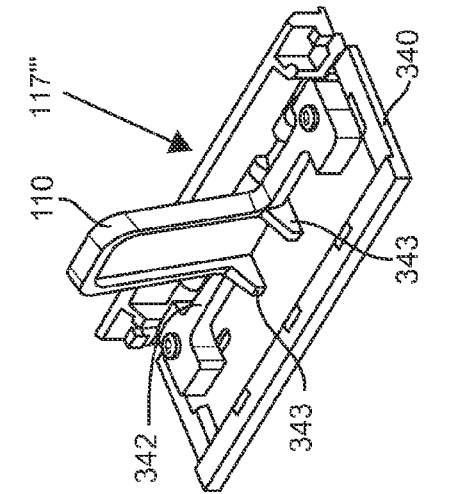

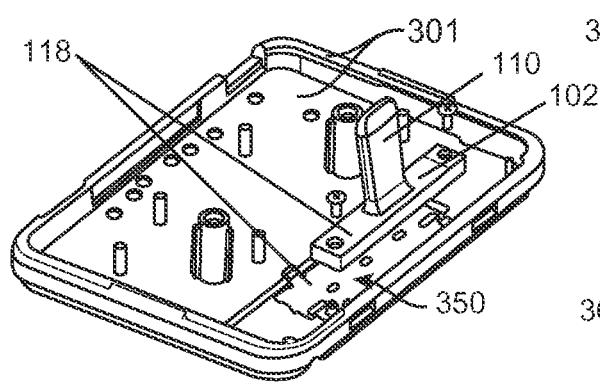
FIG. 9A
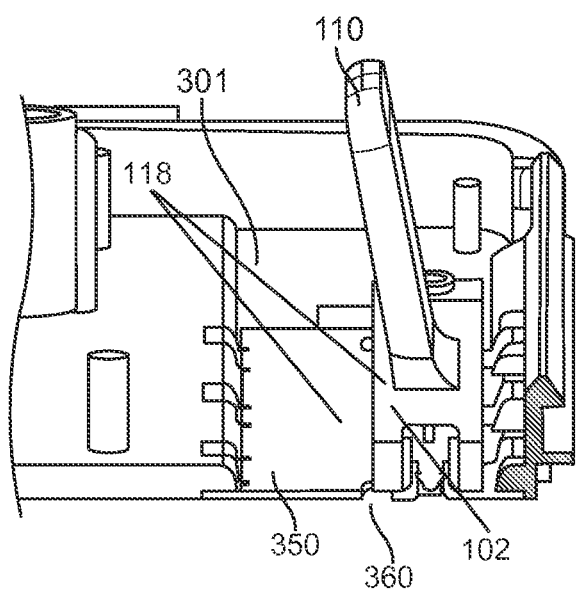
FIG. 9B
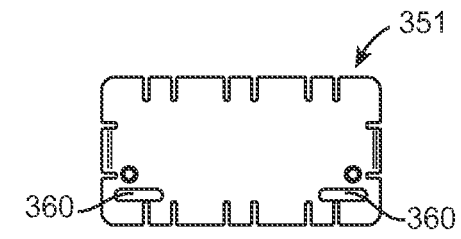
FIG. 9C
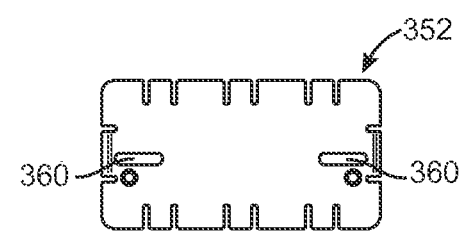
FIG. 9D
FIG. 9E
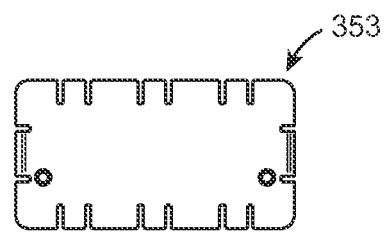
FIG. 9F
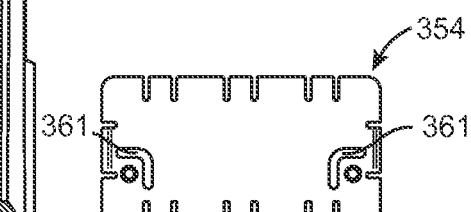
FIG. 9G

DOCK CONNECTOR WITH COMPLIANCE MECHANISM

CROSS-REFERENCES TO RELATED APPLICATIONS

This application is a Non-Provisional Patent Application which claims priority from U.S. Provisional Application No. 61/699,838, filed on Sep. 11, 2012, the full disclosure of which is incorporated herein by reference

BACKGROUND

The present invention relates to a docking station for an electronic device. More particularly, the present invention relates to a docking station having a compliant connector mount with improved durability and flexibility.

Portable electronic devices (such as phones, media players, notebook/netbook computers, tablet computers) are becoming ubiquitous in today's society. Portable electronic devices commonly have display screens (e.g. a touch screen) on which users view and/or select data and functionality. For example, a user may select a video or other presentation to watch. In such circumstances, it is often more convenient for the user to have the device in an upright (viewable) position by placing the device in some sort of holder so that the user is not required to hold the device during viewing.

Additionally, users may wish to interface the display devices with other electronics, for example, playing music through speakers or simply charging the device. However, during such interfacing or charging, the user may still want to view the display and/or controls of the device.

To provide such features and capability, manufacturers provide docking stations or docks in which a user can plug or mount the device. Often the docks will have a connector rising from a surface in a position so that the device can be viewed and/or used when connected. However, the connectors can be weak points, especially when devices become large and heavy, placing additional stresses on the connector, particularly in connectors of relatively small size. The connector may also provide most of the support of the device. Accordingly, the connectors of such docking stations can be damaged by misuse, e.g. being pulled in improper direction.

BRIEF SUMMARY

Embodiments of the present invention provide docking stations having a connector with a compliance mechanism that is more flexible and durable than conventional docks connectors. Some embodiments allow the connector to move relative the dock base when connected to a portable electronic device. This movement of the connector can absorb undesirable forces, thereby reducing a likelihood of the connector breaking from misuse. Examples of compliant movement include sliding, translation, flexures, rotation, sliding, rolling, pivoting and/or some combination thereof. For example, in some embodiments, if a mounted portable electronic device is manually pushed forward, the connector can rotate or pivot within the dock, thereby reducing the likelihood of breakage from such a push.

In one aspect, the invention provides a compliance mechanism configured to flex when the connector is stressed so as to pivot the connector at a pivot point near where the connector protrudes from the dock shell or housing. In some embodiments, the dock may be configured so that flexure or compression of a compliance mechanism pivots the connector about a pivot point at or near where the connector protrudes from the dock shell or housing. The connector may interface with a feature on the dock shell or housing at the pivot point location to control the pivoting movement or the compliance mechanism may be configured to combine compliant movements so that the connector pivots at the pivot point without attachment at the pivot point location. The compliance mechanism may be configured to provide the connector with sufficient rigidity to support a portable device when mounted on the connector within the dock in an upright position, sufficient flexibility to allow angular displacement of a mounted portable device and sufficient elasticity to provide a resilient biasing force to return a mounted portable device from a displaced position to the upright position. The compliant movement may be configured to provide controlled movement within a desired range of movement along one or more directions. For example, the compliant movement may allow a portable device mounted on the connector to tilt forward from a non-stressed mounted plane with increasing resistance to a displaced plane at a maximum angular displacement within a range of 90 degrees or less, or in some embodiments, 45 degrees to 10 degrees. The compliant movement may be configured to distribute and absorb stresses associated with displacement of the connector, thereby reducing the likelihood of damage to the devices or associated connectors. It is appreciated that compliant movement may include pivoting movement about a pivot point at a relatively fixed location or at a location that moves during the compliant movement, particularly in a compliance mechanism that includes a combination of compliant movements described herein.

In another aspect, the compliance mechanism is configured with a resilient bias toward a particular position, such as an upright mounted position, in which an electronic device is supported by the compliance mechanism (and/or at least partly supported by a rear reference surface of the docking station), thereby inhibiting undue strain on the rotatable connector in the non-deflected position. The bias of the compliance mechanism can be controlled by the shape and material properties of the compliance mechanism, as well as its design and overall configuration. For example, in some embodiments, the compliance mechanism is configured to support the connector in an upright position that is tilted back slightly when the compliance mechanism is unstressed and unflexed so as to facilitate mounting of the device or viewing and operation of the portable device by a user when mounted in the dock. The connector may be disposed partly below and partly above an outer shell of a base of the docking station and pivot at a location on the connecter near an opening in the outer shell of the dock base through which the connector protrudes, thereby reducing movement of the connector near the opening. This aspect allows the opening in the shell or housing to be minimized and reduces the likelihood of interference between the connector and the dock shell or housing as the connector pivots.

According to one embodiment, a docking station can include a base, a rear reference surface for at least partly supporting a portable electronic device in the upright position, and a movable connector that is configured to receive and electrically couple to a receptacle connector of the portable device. The movable connector can be coupled to the base by a compliance mechanism and biased toward the upright position. The rear reference surface can be mechanically coupled to the base and adapted to support the portable electronic device when the electronic device is coupled to the rotatable connector in its upright mounted position. The compliance mechanism may include one or more compliance components, such as a compressive material, a torsion bar, pivoting members, flexures or flexure hinges and/or base plates engineered to provide controlled compliant movement of the connector.

BRIEF DESCRIPTION OF THE DRAWINGS

FIGS. 8A-8E show alternative designs of compliance mechanisms in accordance with embodiments of the invention.

FIGS. 9A-11B show engineered base plates for use in compliance mechanisms in accordance with embodiments of the invention.

DETAILED DESCRIPTION

Figure 1:
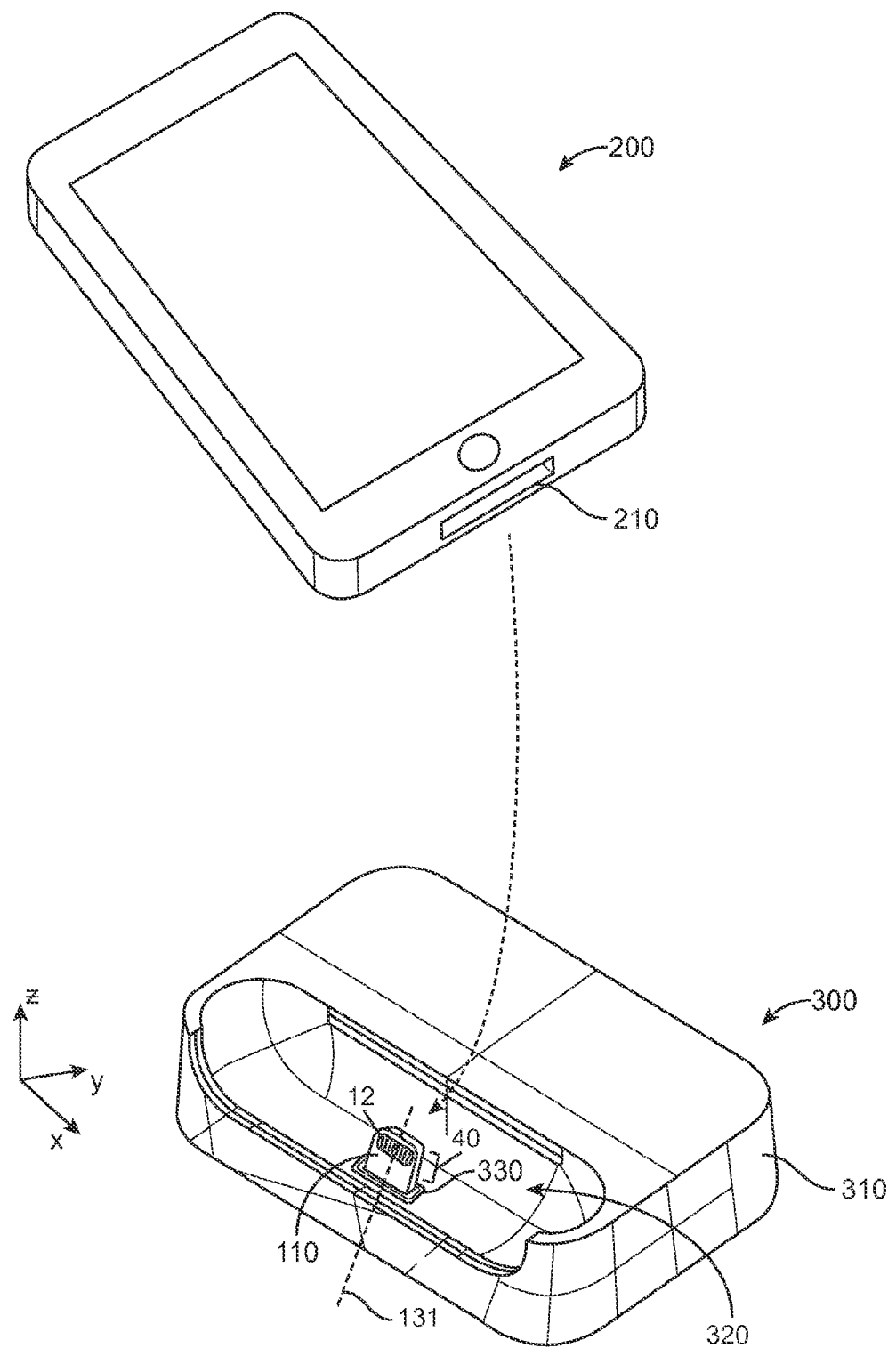
FIG. 1 is a perspective view of a docking mount and portable device according to embodiments of the present invention.

Embodiments of the present invention provide a docking station or dock having a connector with a compliance mechanism that allows for improved durability, flexibility and controlled compliant movement of the connector. These objectives can be accomplished, in part, by allowing the connector to move so that the connected portable electronic device does not subject the connector to a significant amount of force. For example, with limited reference surfaces (surfaces that can touch the electronic device when it is connected with the connector mounted in the dock), a joint of a fixed connector may weaken or break if the portable electronic device is forced off its attachment/detachment axis. Such a force may occur inadvertently when a user reaches for the device. In a dock in accordance with the present invention, the force of the push and/or the force of the weight of the device, which may weaken or compromise the joint in a conventional dock, instead simply moves the connector.

In one aspect, the connector is configured to move or pivot relative to the dock base in order to better distribute the forces when an off axis force is applied, e.g., it moves to comply with the force rather than completely resisting the force by not moving. In some embodiments, the connector is attached to the dock base through a compliance mechanism of which movement allows the connector attached thereto to pivot about a connector pivot point from an upright mounted position to an angularly displaced or tilted position, thereby accommodating a force applied to the connector through a portable device mounted in the docking station. The compliance mechanism may be configured with a bias towards a natural, non-displaced position in which the connector is supported upright, the bias providing a resilient force when displaced so as to inhibit forward tilting movement of the portable device beyond a maximum angular displacement and to resiliently return the connector to the upright position when the applied force is removed. The precise motion of the connector and forces from a biasing mechanism can be tuned to provide a desired motion and feel when a user moves a mounted electronic device.

As used herein, a portable electronic device is of such size and proportion that it may be carried in the hand(s) of a person. Examples of portable electronic devices include but are not limited to media players that play or otherwise transmit audio and/or visual (video or picture) signals (e.g., iPod) and phones that allow users to communicate remotely through wireless connections. Portable electronic devices may also correspond to mini-computers, tablet computers, PDAs, internet or email based devices. In fact, portable electronic devices may be a combination of specific or dedicated devices mentioned above (e.g., a smart phone such as the iPhone™), manufactured and sold by Apple Inc. of Cupertino, Calif., the assignee of the present application.

Embodiments of the invention are discussed below with reference to figures. However, those skilled in the art will readily appreciate that the detailed description given herein with respect to these figures is for explanatory purposes as the invention extends beyond these embodiments. For example, embodiments may be used with various types of connectors between devices, including non-portable devices.

FIG. 1 is a perspective view of a connector assembly in accordance with embodiments of the present invention. An insertable tab 40 of the connector 110 extends upwards from a base of a dock or docking station 300 and includes a group of electrical contacts 12 that electrically couple with corresponding contacts within a connector receptacle when mated. The insertable tab 40 can be attached and removed from the corresponding mating connector receptacle along a mating axis 131 extending along the upright mounted plane. The corresponding mating connector may for example be a connector carried by an electronic device, such as portable electronic device 200. The connectors can slide on/off along mating axis 131 in order to couple and decouple the electrical contacts associated with the connectors. In the embodiment shown, the connector assembly includes a connector 110 that protrudes upwards from within a recessed docking well 320 of a docking station 300 so as to be received within a corresponding connector receptacle 210 of a portable device such that the connector 110, at least in part, supports the portable device 200 when mounted in the upright mounted position. As can be seen in FIG. 1, connector 110 protrudes through an opening 330 in the housing or shell 310 of docking station 300 within the docking well 320. Such a docking station can provide a platform for quickly and easily coupling a portable electronic device to another system or device as for example a computer, a power source, or peripheral devices such as a monitor, a keyboard, speakers, etc. The docking station can also hold the electronic device in a position suitable for viewing a display of the electronic device.

Docking stations may be a stand-alone unit that communicates with other devices or systems through wired (e.g., cables) or wireless (e.g., Bluetooth) connections, or alternatively, a docking station may be integrated directly into the other devices or systems. In one embodiment, connector 110 may be connected to other electronics housed within the docking station via a flexible or movably-enabled connection, such as swiping contacts, wires, traces, flexible circuits and/or the like. Some of these examples may include slack so that the connector can move between positions. The electronics associated therewith may be widely varied, for example including various circuit boards, controllers, connectors, and the like. The electronics can be fixed within the body or configured to be movable to help manage the connection between the electronics and connector 110, as the connector moves. For example, a printed circuit board may slide along rails. Certain embodiments are described in more detail below.

Docking station 300 can be configured to hold electronic device 200 in a position suitable for viewing a display 213 of the electronic device, referred to herein as an upright mounted or mounting plane. Docking station 300 may include a base, which may contain various electronics, ballast, and the like. The base can serve to keep docking station 300 balanced and supported on a surface such as a table, as well as to balance and support electronic device 200 when mounted therein. Docking station 300 may also provide one or more reference surfaces for helping support the electronic device in the upright mounted position.

Connector 110 may be coupled to other connectors, ports, jacks, transceivers, or cables of the docking station, thereby providing external connections to the other devices or systems. In the case of an integrated docking station, connector 110 may be wired directly to the components of the host device or system. In some embodiments, connector 110 is substantially on its own while in other embodiments, the connector may be part of a module that includes a secondary structure, such as a shell or housing.

In one aspect, connector 110 can correspond to USB, Firewire, or other standardized connector formats. In one example, connector 110 is an 8-pin connector compatible with the Apple iPod® and iPhone™ devices. In an embodiment, the 8-pin connector has a thin low profile (as shown) with spaced apart side by side pins, which may be in a single row. The electronic device can have a female connector receptacle connector 210 that connects with connector 110, which may be a male connector plug. In alternative embodiments, the electronic device can have a male connector receptacle that connects with a female connector plug of a dock. In such an embodiment, the female receptacle may be situated in a housing.

Figure 2:
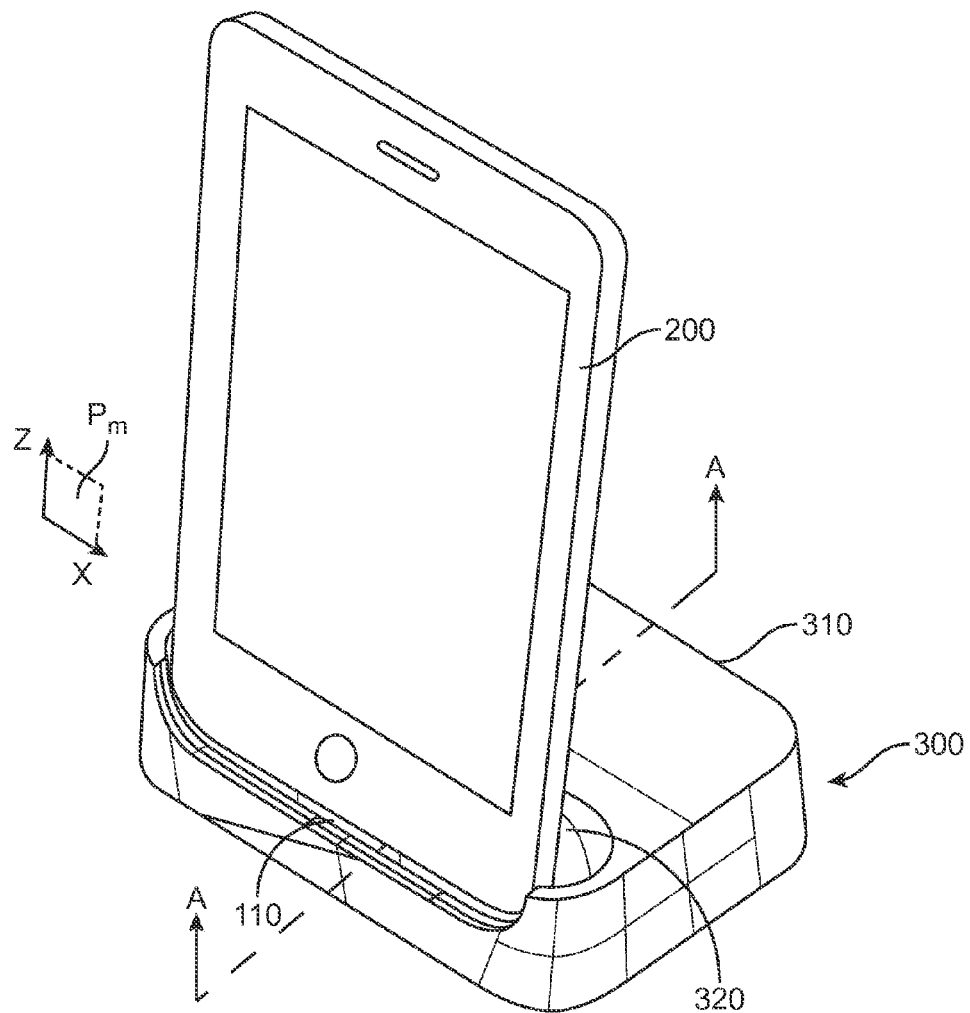
FIG. 2 shows the portable device of FIG. 1 mounted to the connector within the docking station.
Figure 5A:
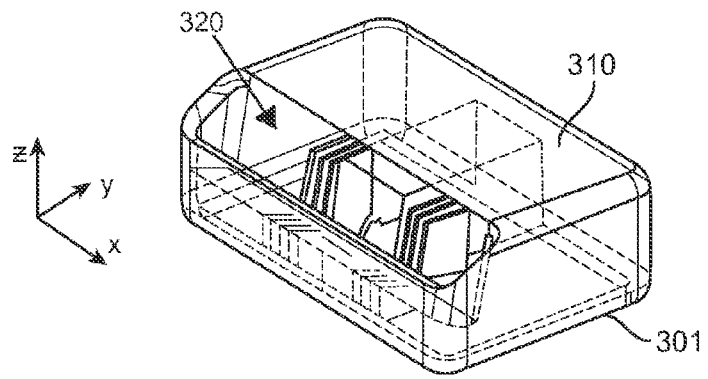
FIGS. 5A-5E show an example dock having a connector with a compliance mechanism.
Figure 5B:
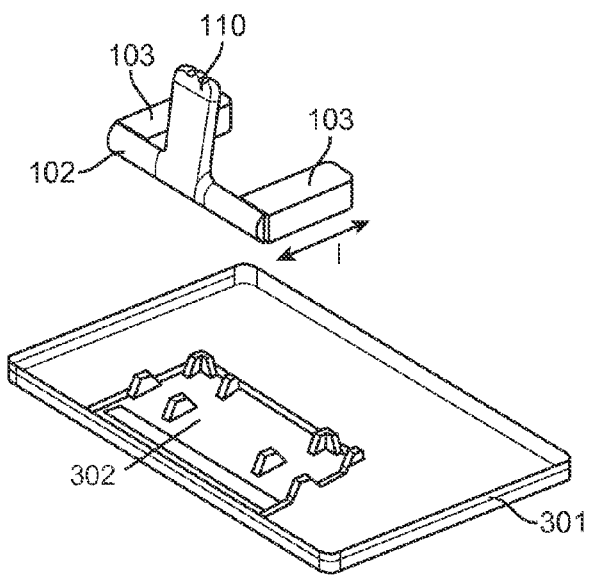
Figure 5C:
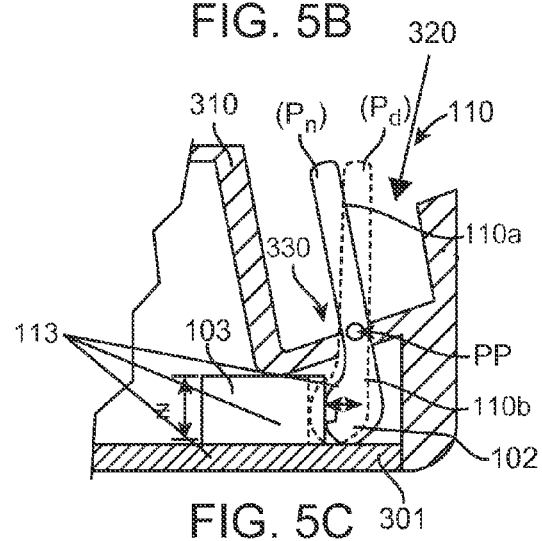

In one embodiment, an insertable tab of connector 110 protrudes through an opening 330 in an outer shell or housing 310 of the docking station 300, a first section 110b being disposed within the shell or housing of the dock and a second section 110a protruding through the opening and extending from the dock shell or housing, as shown in FIG. 5C and in the various embodiments depicted herein. The second section 110a includes the insertable tab portion 40 having a plurality of electrical contacts 12 disposed thereon being exposed and substantially free from external walls and surfaces (e.g. no or limited walls that surround or are adjacent to the connector) to facilitate mating engagement within the corresponding receptacle 210 of the portable device 200. As such, connector 110 may be configured to support electronic devices coupled thereto via a corresponding mating connector with limited or no reference surfaces provided for the electronic device. While in various embodiments connector 110 protrudes from an opening 330 within a docking well 320 of a dock 300, connector 110 need not be disposed within a recess or cavity and instead may extend outward from a surface such that its sides are exposed. As shown in FIG. 2, in various embodiments, connector 110 is configured to protrude upwards in an upright position (a major component extending along the z axis) so that when a portable device 200 is mounted thereon, the portable device, as well as connector 110, extends along a mounting plane $P_m$ through which insertion axis 131 extends.

Because connector 110 can be exposed and substantially free from reference surfaces, undesirable off-axis forces may be exerted on connector 110 especially when an electronic device is connected thereon. For example, during removal of the electronic device from the dock, the electronic device may be rotated, pushed, pulled away from the mating axis thereby imparting undesirable forces on connector 110. By way of example, if mating axis 131 extends in the direction of the z axis, undesirable forces may be imparted on the connector by translating the electronic device in x and y as well as rotations about the x, y and z axes. In addition, there may even be some forces pulling/pushing on the connector along the z axis due to friction between the mating connectors. Certain configurations of connector 110 may lead to more susceptible areas of undesirable forces.

Figure 3A:
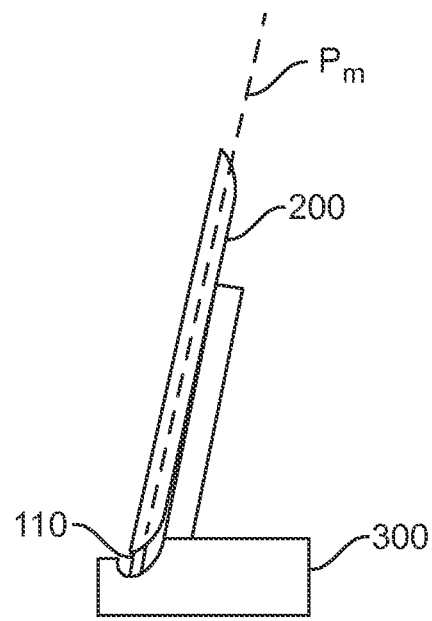
FIGS. 3A-3B show a side view of the portable device mounted in the docking station in an upright position and a side view of the portable electronic device tilted forward relative docking station.
Figure 3B:
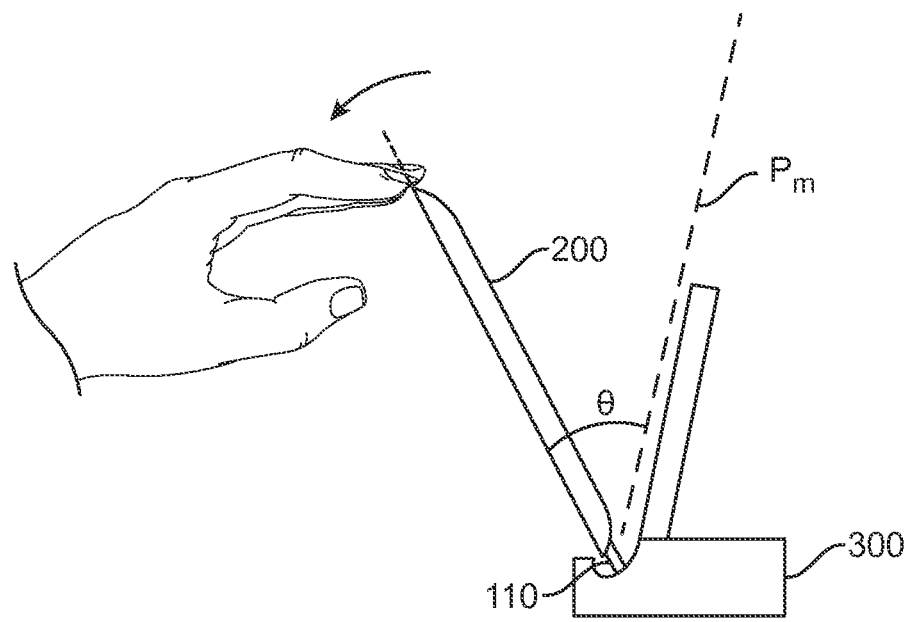

Of particular concern, are torques and bending stresses that may be applied to connector 110 through manual articulation of a portable device 200 mounted thereon, such as shown in FIGS. 3A-3B. It may be desirable to allow pivotal movement of the connector 110 relative to the dock 300 to accommodate angular displacement of the portable device from the mounting plane $P_m$, such as when a user may tilt the portable device 200 forward by an angular displacement of θ, as shown in FIG. 3B. Although various mechanisms may be used to allow for such rotational movement of the connector 100, such mechanisms may result in excessive movement of the connector 100 so that an opening through which the connector 110 extends must be larger than desired to provide sufficient clearance for movement of the connector 110. In addition, the presence of such mechanisms may interfere with the shell or housing of the dock or require additional clearance within the dock itself. Therefore, it would be desirable to provide a flexible, movable connector 110 that pivots substantially about a point at or near where the connector 110 protrudes through an opening so as to minimize the required clearance between the connector 110 and the shell or housing 310 of the dock 300. This presents challenges, however, since the connector 110 is often fabricated from a substantially rigid material to withstand the stress of ordinary use and ensure integrity of the electrical connection and the connector itself, particularly in connector having relatively small dimensions. It would be further desirable to provide a controlled compliant movement of the connector 110 within a desired range of angular displacements along one or more axes, while reducing the overall size and complexity of the mechanisms by which such movement of the connector 110 is achieved.

Figure 4:
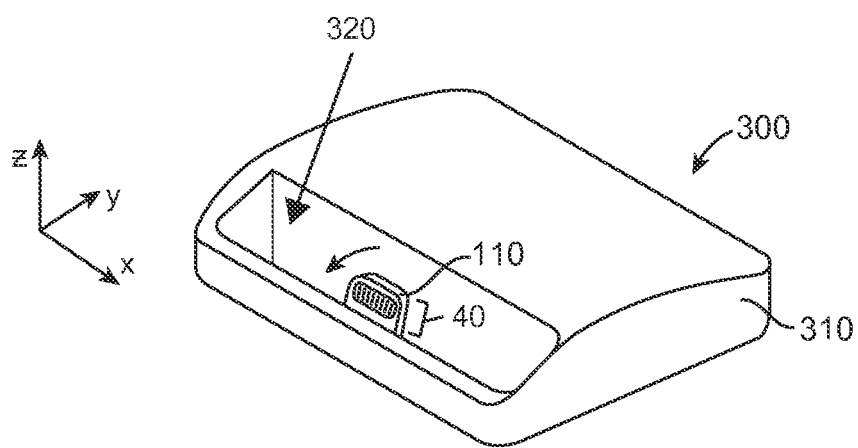
FIG. 4 shows an example docking stations having a connector with a compliance mechanism attached thereto.

In one aspect, to achieve the above noted objectives, the connector 110 is attached to a base of the dock 300 by a compliance mechanism 113 that allows for pivoting movement of the connector 110 at a pivot point relative to the base at or near where the connector 110 protrudes from within well 320 of the shell or housing 310 of the dock 300. This pivoting movement may be provided by a combination of compliant movement, such as by a combination of rotational or rolling movement and translational movement of a base portion of the connector relative the base. The compliance mechanism may be configured to allow for movement of the connector 100 about a pivotal axis substantially parallel to the x-axis, such as shown by the arrow in FIG. 4, or along the y-axis, z-axis or various other axes or combinations thereof, as desired.

FIGS. 5A-5C illustrate an example of one such compliance mechanism 113, the compliance mechanism pivots the connector at pivot point PP where the connector protrudes through opening 133 in the dock housing or outer shell 310 attached to the docking station base 301. The compliance mechanism 113 further includes a laterally-extending connector base 102 at bottom end of the connector 110 disposed within the dock 300 that is configured to translate along a top surface 302 of base 301 and contact a damping member 103, such as a pair of foam dampers. In some embodiments, the connector 110 may rely on a combination of rotational and translational movement so as to pivot at or near the opening without requiring attachment to the shell or housing at the pivot point location. The connector base 102 may comprise an elongate member that extends laterally a distance wider than the width of the connector 110 along the x-axis so as to distribute applied forces across an increased width and to contact the damping member 103, a pair of foam dampers, disposed near opposite ends of the elongate connector base 102. The elongate member may be formed as a cylindrical or rounded member such that a longitudinal cross-section of the elongate base 102 is circular, semi-circular, elliptical, or various other oblong or curved shapes to allow rotational or rolling movement of the connector along the top surface 302 of the dock base 301 with the connector base 102. The foam dampers 103 may be configured, as desired, to provide various levels of resilience so as to provide a biasing force against the connector base 102 to resist backwards translational movement of the connector base 102 and provide a resilient bias to return the connector into the upright non-displaced position ($P_a$) from a forward tilted, displaced position ($P_d$). In some embodiments, it may be useful to increase the length, l, of the foam dampers 103 used in the compliance mechanism since increased length reduces the percentage of the foam damper which is compressed during cycling. This aspect allows the resistive force and resilient bias provided by the foam dampers 103 to be tuned or controlled, as desired, by selection of foam dampers of varying material properties or dimension.

Figure 5D:
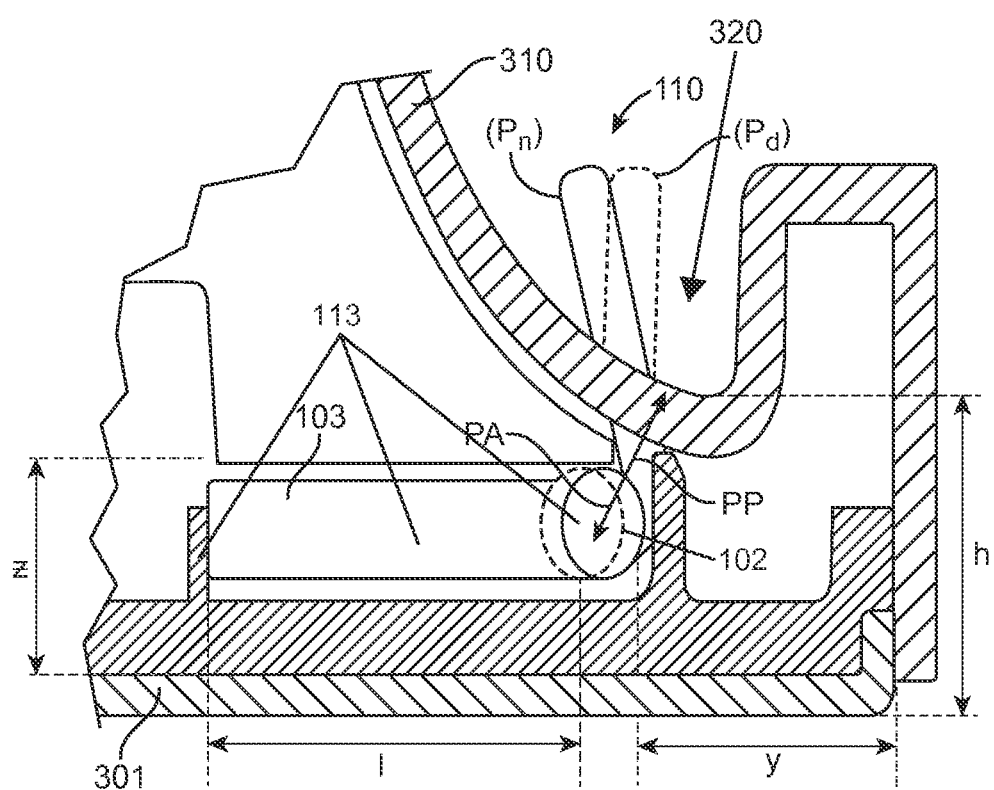
Figure 5E:
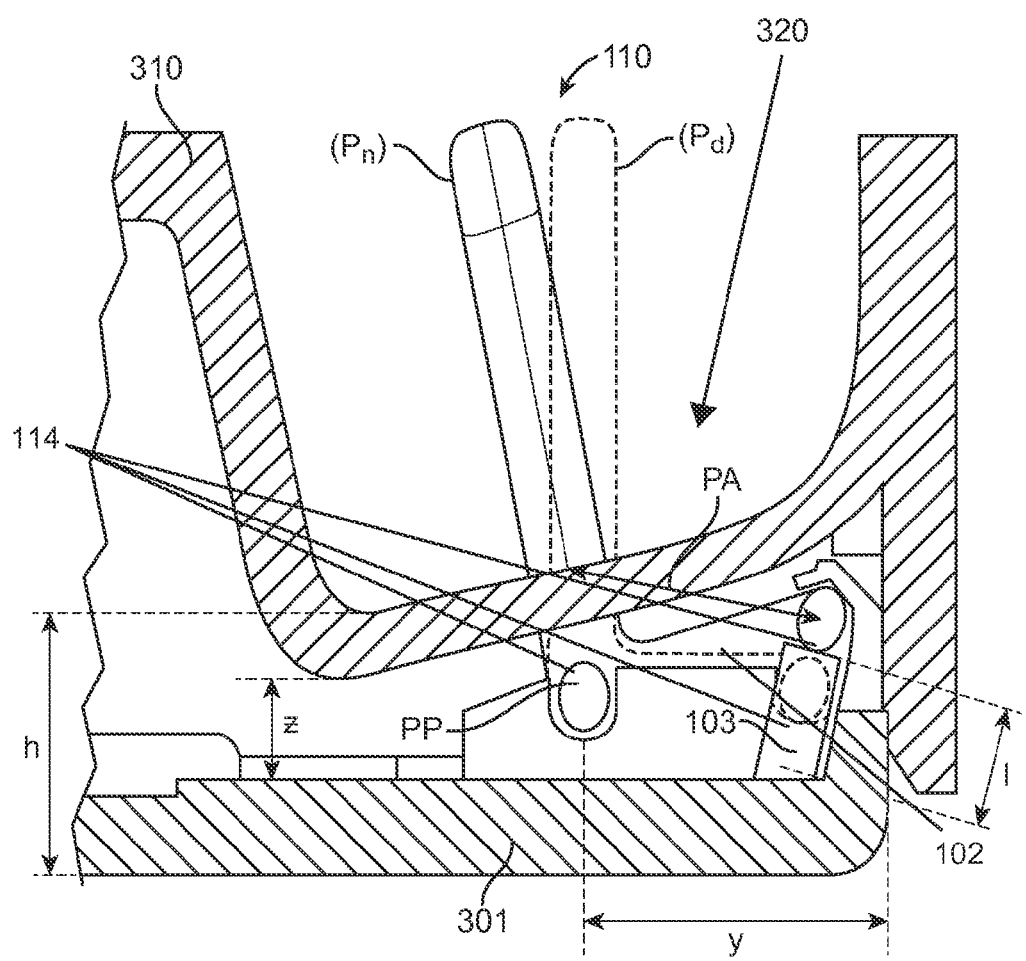

FIGS. 5D and 5E illustrate two other similar embodiments utilizing compressive foam. As can be appreciated by reference to each embodiment, the dimensions and locations of the compliance mechanism may be varied according to various configurations depending on the shape of the dock shell or housing, in particular according to a desired clearance between the dock shell or housing and attached base of the dock, and still provide similar advantages and functions as described above. In the embodiments shown in FIGS. 5D and 5E, the compliance movement can be described with reference to a pivotal arm PA that extends from the connector base 102 and the opening from which the connector protrudes. The material properties and dimensions of the damping member 103 may be selected according to the pivotal arm to provide the desired resistive and resilient biasing force. The z clearance between the base 301 and the inside housing surface along the well of the dock 320 may vary according to the size and location of the damping members used in a given embodiment. For example, in an embodiment such as shown in FIG. 5D where the damping member extends along the y-axis, the damping member 130 of the compliance mechanism 113 may require more z clearance than in an embodiment, such as shown in FIG. 5E, where the damping member 130 of the compliance mechanism 114 is configured to compress along another more vertical axis. The increased z clearance in the embodiment in FIG. 5D allows use of compressive foam of a suitable length to provide the desired resilient biasing forces and damping forces, while the reduced z-clearance in the embodiment of FIG. 5E allows for a dock with a smaller height or deeper dock well 320.

In the embodiment of FIG. 5D, the compressible foam member 103 is disposed horizontally along the base portion 301 such that forward movement of connector 110 pivots the connector 110 about pivot point PP by moving a base portion of the connector 110 towards the rear of the dock 300 thereby compressing the compressible foam member 103. In some such embodiments, the distance of the pivotal arm PA by which the connector pivots (e.g. the distance between the connector at the opening in the docking shell or housing 310 and the base portion that contacts the compressible foam member 103) is about 4 mm, a length (l) of the compressible member is about 12 mm, a height (h) between the top surface of the docking well 320 defined by the housing or shell 310 and the base 301 is about 8 mm, and the z distance being about 6 mm or more to allow sufficient clearance for the compressible foam member 301 to extend horizontally along the base 301.

In the embodiment of FIG. 5E, the compressible foam member 103 is disposed in the front portion of the docking shell or housing 301 such that pivoting movement of the connector 110 moves a terminal portion of the L-shaped base downwards thereby compressing the compressive foam 103 downward by a distance (l). In some such embodiments, the distance of the pivotal arm PA is about 4 mm, the length (l) of the compressible foam member 103 is about 2 mm, the height (h) is about 3.2 mm and the z-clearance is about 2 mm. By configuring the compliance mechanism to utilize a compressible foam member 103 within a front portion, this embodiment allows a reduced z-clearance and height as compared to the embodiment in FIG. 5D. In such an embodiment, the foam damping member is typically relatively shorter in length and constructed of a material of a higher compressibility than in the embodiment shown in FIG. 5D.

Figure 6A:
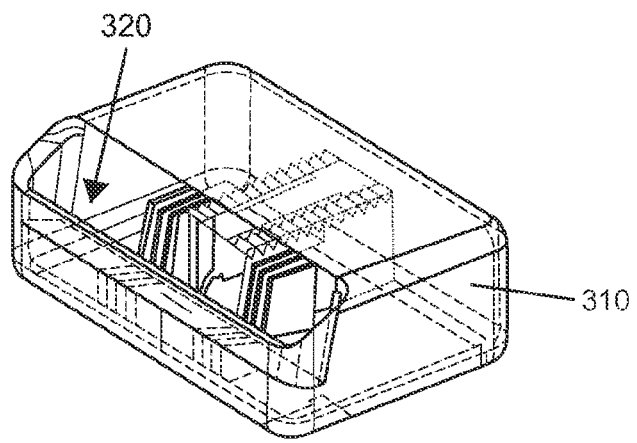
FIGS. 6A-6C show an alternative example dock having a connector with a compliance mechanism.
Figure 6B:
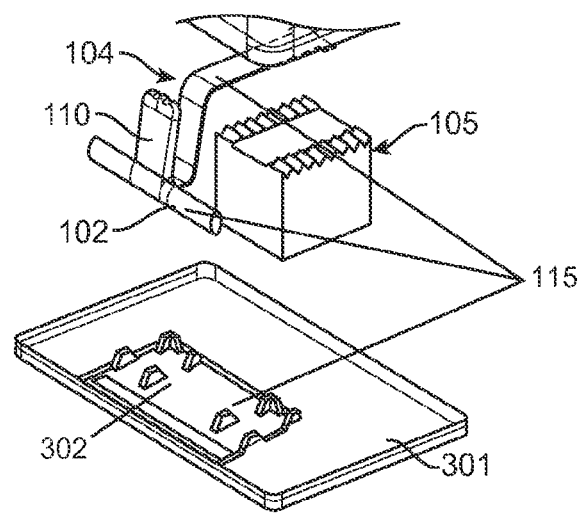
Figure 6C:
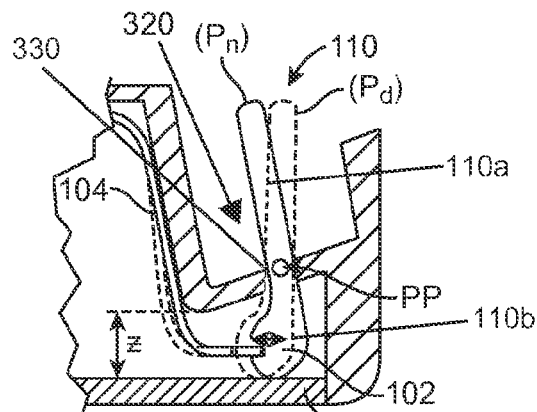

FIGS. 6A-6C illustrate another connector dock with a compliance mechanism 115 [[100]] that utilizes a spring steel member 104 and an interfacing damping block 105, damping block 105 having a notched or corrugated top surface that interfaces with a corresponding surface on the underside of the spring steel member 104 so as to constrain movement of an upper portion of the spring steel member 104 or to provide increased resistance to backwards movement of the spring steel member 104 thereby providing compliant movement through the elongate connector base 102 attached to the spring steel member 104. The notches can be used to provide a differing range of movement and resilient bias based on which notch the underside of the upper portion of the spring interfaces with. This aspect can be used to tune the compliance movements and forces, as desired, or can be used to provide intermittent or variable forces depending on the magnitude of the forces on the connector. The embodiment shown utilizes an elongate connector base 102 at a base of the connector 110 that translates along the y-direction along the top surface of base 301, such as by sliding or rolling movement of the curved surface of connector base 102 along the top surface 302 of the dock base 301, so that the connector pivots about a pivot point PP at or near where the connector 110 extends through the opening in the dock shell or housing 310 with the dock well 320. As the connector base 102 translates along the y-axis, the lower portion of spring 104 interfaces with the connector base 102 to provide resistance to the backwards translation and to provide the resilient biasing force to return the connector 110 to the mounted plane after the external force applied to the connector 110 is removed. It is appreciated that compliant movement may include pivoting movement about a pivot point that moves during the compliant movement, particularly in a compliance mechanism that includes a combination of compliant movements as described herein. For example, the connector 110 may move along one or more axes as the connector 110 pivots during the compliant movement.

Figure 7A:
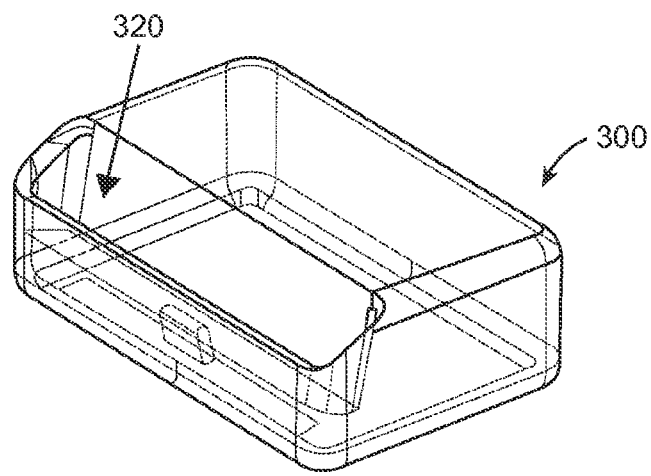
FIGS. 7A-7C show an alternative design of an example dock having a connector with a compliance mechanism.
Figure 7B:
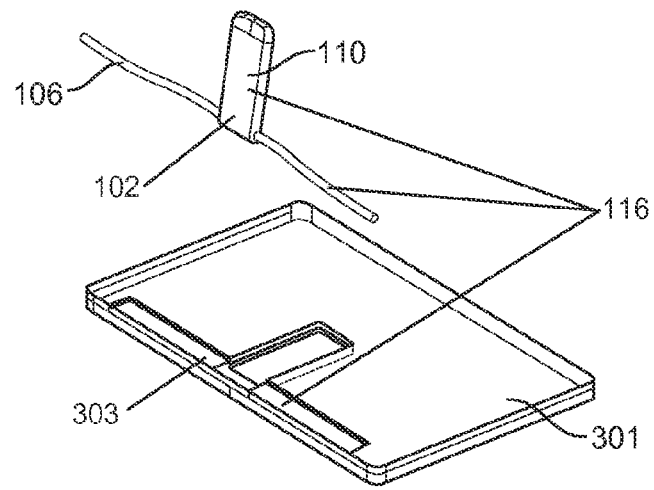
Figure 7C:
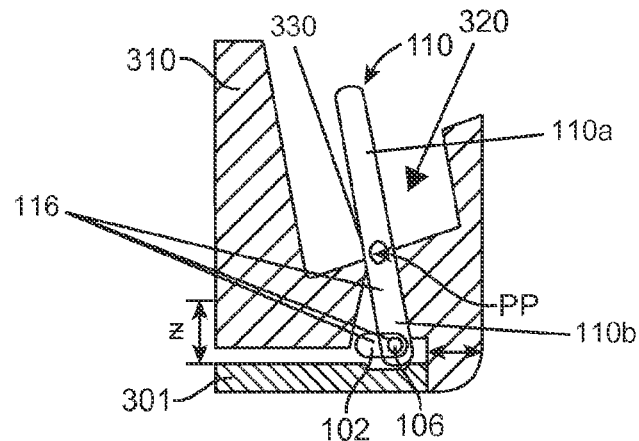

FIGS. 7A-7C illustrate another connector dock having a compliance mechanism 116 that utilizes a torsion spring or member 106, such as a wire or bar. In this embodiment, an elongate torsion bar or spring 106 extends laterally from the connector base 102, which may be the same width as the connector 110, and translate backwards along the top surface 303 of base 301 along the y-axis, the combined movements allowing the connector 110 to pivot about the connector pivot point PP. The torsion bar or spring 106 provides resistance to torsional movement so as to control and limit pivoting movement of the connector 110. The opposing ends of the torsion wire 106 may be secured to the base 301 so as to provide torsional resistance to rotation of the central portion of the torsion wire attached to the connector base 102 and further provide resistance to backwards translation of the connector base 102 by tension in the torsion wire 106. This configuration also allows for a dock housing design having reduced or minimal z-height clearance, as shown in FIG. 7C.

FIGS. 8A-8E illustrate various other flexible features within compliance mechanisms in accordance with various embodiments of the invention. FIG. 8A illustrates a compliance mechanism 117 attached to connector 110 that includes a foam rocker member 341 disposed under a laterally-extending connector base 102 on a base plate 340, the compressible foam rocker member providing damping to torsional forces and a resilient biasing force to return the connector 110 to the upright mounted position. FIG. 8B illustrates a compliance mechanism 117" attached to connector 110 that includes a foam rocker 341 combined with a torsion bar 342 that provides increased resistance and resilient biasing force, as desired. FIG. 8C illustrates a compliance mechanism 117" attached to connector 110 that includes an aligned torsion bar 342 is aligned with the connector 110. FIG. 8D illustrates a compliance mechanism 117'" attached to connector 110 that includes an aligned torsion bar 342 having rear hard stops 343, the rear hard stops 343 preventing further torsional movement of the connector 110 beyond a specified range or to maintain the connector 110 in an upright position, the hard stops 343 countering a biasing force within the torsion bar 342. FIG. 8E illustrates a compliance mechanism 117" attached to connector 110 that includes an aligned torsion bar 342 with an alternative configuration having front hard stops 344 in addition to rear hard stops 343 that together limit compliant movement of the connector both forward and backwards from the mounted plane.

In some embodiments, the compliance mechanism includes an engineered base plate to which other components of the compliance mechanism may be attached. Various aspects of the base plate may contribute to the flexibility and damping properties of the compliance mechanism, such that the flexibility is engineered by use of various cut-out and slots to control the flexure or damping properties of the base plate and in turn any components attached thereto. Examples of various base plates that may be engineered to provide various differing compliance are shown in FIGS. 9A-9G.

FIGS. 9A-9B illustrate a compliance mechanism 118 that includes an base plate 350 attached to a laterally-extending connector 102 of the connector 110, the base plate b being coupled to the dock base 301 and engineered to provide flexural movement in one or more portions. FIGS. 9C-9G illustrate various differing designs of base plates in which various types of slots are included in various locations and in various shapes to decrease bending stiffness of the base plate in particular locations to provide the desired compliant movement. Elongated slots, such as slots 360 shown in the base plate 351 in FIG. 9C, can be used to allow for increased flexibility at or near the portion of the bottom plate at which the slot is located. The position of the slot may be used to control the direction of flexibility in one or more directions, as desired. For example, the slots 360 near one side of the base plate 351 shown in FIG. 9C would provide increased flexure and pivotal movement of the base plate at or adjacent the slots. In another example, positioning the slots 360 along a center portion of the plate, such as in the base plate 352 shown in FIG. 9D, would provide increased flexure at or adjacent the center portion of the base plate. FIG. 9E shows a base plate 353 without slots. In some embodiments, the plate may include slots that vary in direction, such as the L-shaped slots 361 in base plate 354 shown in FIG. 9F, which may provide increased flexibility in different directions. In some embodiments, the slots are positioned at corresponding locations on each side of the base plate laterally from the connector 110 to provide uniform flexibility and compliant movement of the connector 110 such as in base plate 355 shown in FIG. 9G having slots 360 on each side laterally of where connector 110 is attached. Any of the slots described above can be included in various configurations, positions and combinations on differing base plates to allow for increased control of the flexibility and stiffness of the compliance mechanism, even when the other remaining components of the compliance mechanism are the same.

Figure 10:
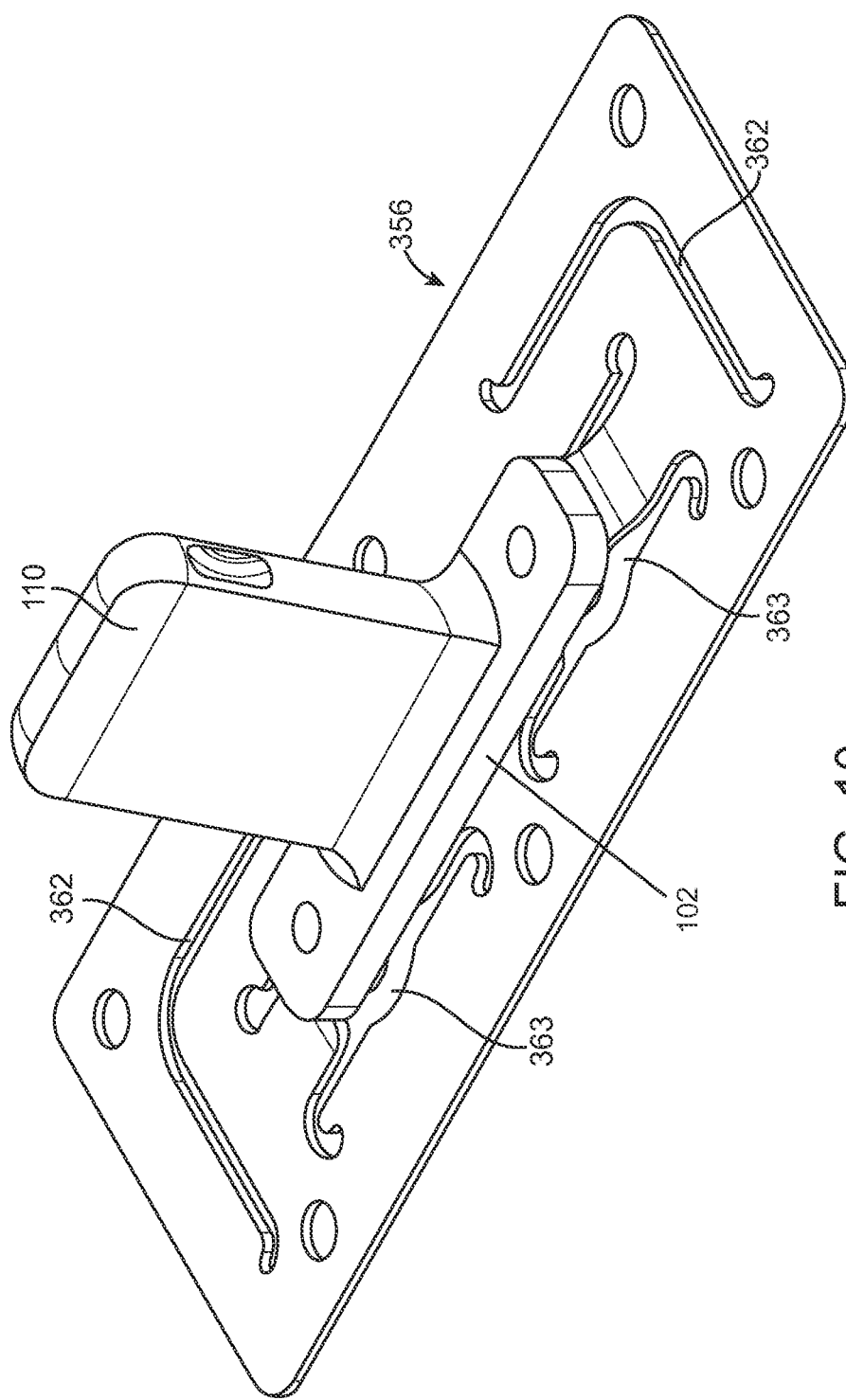
Figure 11A:
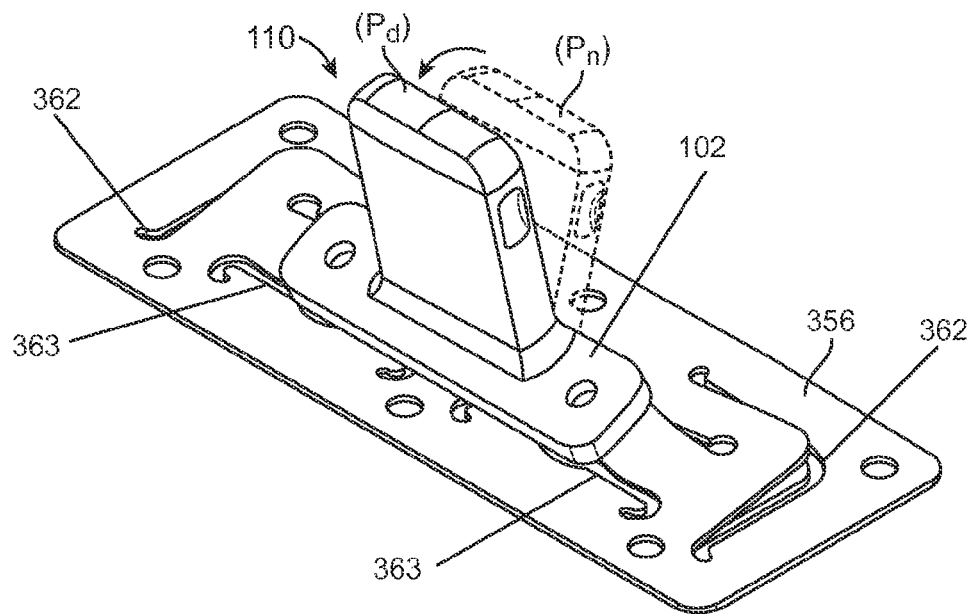
Figure 11B:
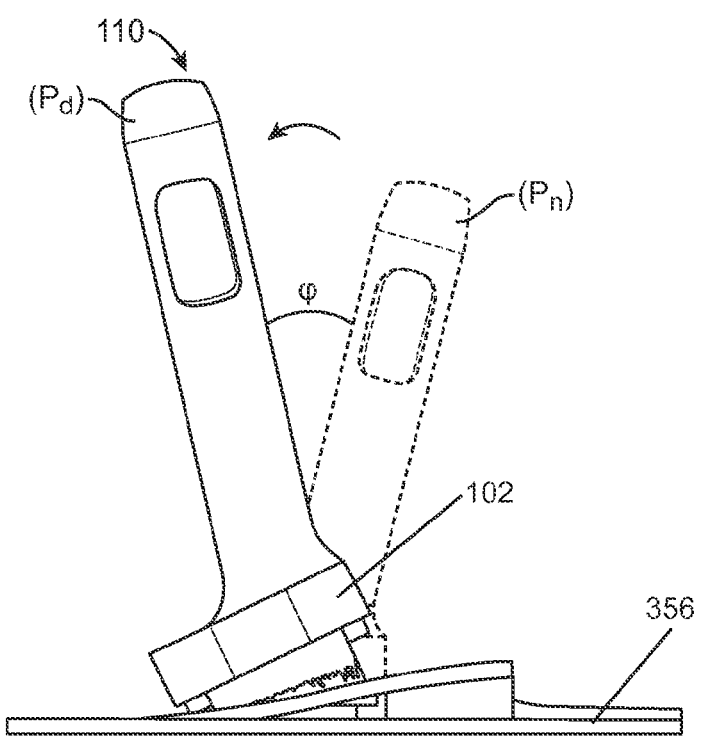

FIGS. 10 and 11A-11B graphically illustrate how the size, shape and location of slots within an example base plate 356 coupling the connector 110 base to the base of the dock may provide increased flexibility. The base plate 356 in FIG. 10 includes elongated slots 363 at least partly surrounding a base portion 102 of the connector 110 attached thereto so as to partially isolate the connector 110 from the surrounding base plate and additional L-shaped slots 362 the outside corners of the base plate to allow the partially isolated area on which the connector 100 is disposed to flex at an angular displacement away from the L-shaped slots 362. Similar L-shaped slots 362 disposed on opposite sides of the base plate may be used to cause a corresponding or similar flexure in the opposite direction. As can be seen by FIGS. 10A-11B, the direction, magnitude of angular deflection, as well as the resilient biasing force provided by the compliance mechanism may be controlled by engineered flexibility of the base plate by which the mechanism attaches to the docking station. As shown in FIG. 10, the base plate 356 may include a combination of elongated slots 363 and L-shaped slots 362 to provide a desired flexural movement of the base plate to allow for the desired compliant movement of connector 110. An example of the flexural movement of base plate 354 having a combination of slots that allows compliant movement of an attached connector 110 between an upright non-displaced position ($P_n$) and a tilted, displaced position ($P_n$) through an angular deflection of $\phi$ can be seen in FIGS. 11A-11B.

It is appreciated that although in various embodiments the compliance mechanism is described as including at least a first and second flexure or flexure hinge, the complaint mount is not so limited and may include additional flexure hinges or varying combinations of flexure hinges, as desired, to provide additional flexibility or improved control over the movement of the connector relative to the dock. The specific details of particular embodiments may be combined in any suitable manner or varied from those shown and described herein without departing from the spirit and scope of embodiments of the invention. Moreover, the invention may also provide other features of docking stations, such as speakers, a video screen, computers, and charging mechanisms.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A docking station for a portable electronic device, the docking station comprising:
   a dock base attached to an outer shell, the outer shell having an opening in a docking well defined by;
   a movable connector extending from a connector base to an insertable connector tab protruding through the opening in the outer shell, the connector base provided on a first section of the connector disposed below the outer shell and the insertable tab provided on a second section of the connector disposed above the shell and configured to electrically couple to a receptacle connector of the portable electronic device when mated therein; and
   a compliance mechanism interfacing with each of the dock base and the movable connector, the compliance mechanism configured to control compliant movement of the connector in response to an external force applied to the second section of the connector, the controlled movement including pivoting the connector about a pivot point at a location on the connector adjacent the opening in the outer shell.

2. The docking station of claim 1, the compliance mechanism being coupled to the connector base a distance away from the pivot point location such that a combination of rotational and translational movement of the connector base pivots the connector about the pivot point.

3. The docking station of claim 1, the connector configured to pivot about the pivot point without attachment to the housing at the pivot point location.

4. The docking station of claim 1, the connector being movable between a displaced position and non-displaced position and the compliance mechanism is configured with a resilient bias towards the non-displaced position of the connector.

5. The docking station of claim 1, the connector base extending laterally in each direction from the connector and the compliance mechanism comprises damping members interfacing with the laterally extending connector base on each side of the connector.

6. The docking station of claim 5, the damping members comprising compressible foam members.

7. The docking station of claim 1, the compliance mechanism comprising a spring having a first and second end, the first end interfacing with the connector base and the second end interfaces with the dock base or associated component.

8. The docking station of claim 7, the compliance mechanism comprising a Z-shaped spring in which the second end interfaces with a damping block coupled with the dock base.

9. The docking station of claim 8, the damping block comprising a corrugated surface interfacing with the second end of the Z-shaped spring such that the Z-shaped spring provides variable or intermittent resilient forces on the connector base according to a position of the second end along the corrugated surface.

10. A docking station for a portable electronic device, the docking station comprising:
    a dock base attached to an outer shell, the outer shell having an opening in a docking well defined by the outer shell;
    a movable connector extending from a connector base to an insertable connector tab protruding through the opening in the outer shell, the connector base provided on a first section of the connector disposed below the outer shell and the insertable tab provided on a second section disposed above the shell and configured to electrically couple to a receptacle connector of the portable electronic device when mated therein; and
    a compliance mechanism coupled with each of the dock base and the connector that supports the movable connector in an upright mounting position, the compliance mechanism comprising an elongate torsion member coupled with the connector base providing resistance to a pivoting movement of the movable connector away from the upright mounting position.

11. The docking station of claim 10, the elongate torsion member comprising one or more torsion bars extending laterally from the connector base substantially orthogonal to a direction of the pivoting movement.

12. The docking station of claim 11, the one or more torsion bars comprising one or more hard stop members that limit pivoting movement of the connector away from the upright mounting position.

13. The docking station of claim 12, the compliance mechanism being configured to inhibit the angular displacement of the second section of the connector beyond a maximum angle within a range of about 10 to 45 degrees from the upright mounting position.

14. The docking station of claim 11, the compliance mechanism further comprising a compressible foam rocker disposed between the torsion member and the dock base so as to increase flexibility beyond that of the torsion member.

15. The docking station of claim 10, the elongate torsion member comprising a torsion wire coupled with the dock base at opposite ends and coupled with the connector base at a central portion so as to provide torsional resistance and resistance to translation of the connector base by tension.

16. The docking station of claim 10, the compliance mechanism being configured with sufficient flexure to allow a forward angular displacement of the connector from the upright mounting position when a forward displacing force is applied to the connector.

17. The docking station of claim 16, the compliance mechanism being configured with sufficient elasticity so as to resiliently return the connector to the upright mounting position when the displacing force is removed.

18. A docking station for a portable electronic device, the docking station comprising:
    a dock base attached to a dock housing;
    a plug connector configured for removable mating engagement with a corresponding connector of the portable electronic device, the plug connector having a connector base portion and an insertable tab that extends longitudinally away from the connector base portion protruding through an opening in a docking well defined by the dock housing, the insertable tab having a plurality of external contacts formed thereon to enable data and power transmission through the plug connector;
    a flexible base plate coupling the plug connector to the base dock base and configured to support the plug connector so that the insertable tab extends away from the base plate in an upright position for mounting of the portable electronic device, the flexible base plate comprising one or more openings that decrease a bending stiffness of the flexible base plate in a direction along which the connector is pivoted.

19. The docking station of claim 18, the one or more openings defining one or more flexure zones in the base plate to allow pivotal compliant movement of the connector when the one or more flexure zones are flexed in response to an external force applied on the insertable tab.

20. The docking station of claim 19, the base plate being configured with sufficient flexure to allow a forward angular displacement of the connector from the upright mounting position when a forward displacing force is applied to the connector.

21. The docking station of claim 20, the base plate being configured with sufficient elasticity so as to resiliently return the connector to the upright mounting position when the displacing force is removed.

22. The docking station of claim 18, the base plate having one or more elongate slots elongated in a lateral direction from the connector so as to allow the flexure zones to flex away from surrounding areas of the base plate and allow pivoting movement of the connector away from the upright position.

23. The docking station of claim 18, the one or more opening comprising two or more openings located in corresponding positions on the base plate on each side of the connector width-wise.

24. The docking station of claim 18, the base plate having at least two L-shaped slots in opposite corners along a side of the base plate substantially parallel to a width of the connector.

25. The docking station of claim 18, the one or more openings comprising elongate slots, curved slots, L-shaped slots or any combination thereof, to provide controlled flexural movement of the connector along one or more axes.

* * * * *